United States Patent [19]

Danielson et al.

[11] Patent Number: 4,997,032
[45] Date of Patent: Mar. 5, 1991

[54] THERMAL TRANSFER BAG

[75] Inventors: Richard D. Danielson, Hastings; David A. Hesselroth, St. Paul Park; Ralph J. Stein, Jr., So. St. Paul, all of Minn.

[73] Assignee: Minnesota Mining and Manufacturing Company, St. Paul, Minn.

[21] Appl. No.: 503,839

[22] Filed: Apr. 3, 1990

Related U.S. Application Data

[63] Continuation of Ser. No. 101,375, Sep. 25, 1987, abandoned.

[51] Int. Cl.$^5$ ............... H01L 23/473; F28D 15/00
[52] U.S. Cl. ................ 165/46; 165/104.19; 165/104.33; 361/385; 174/15.1
[58] Field of Search ........... 165/104.19, 104.33, 165/46; 361/385, 386; 174/15.1, 15.2

[56] References Cited

PUBLICATIONS

Hultmark et al., J. M. *Thermal Enhancement Modules* IBN Technical Disclosure Bulletin vol. 19, No. 8, 1/1977.
"Liquid Heat Sink Cools Microcomputer," *Design News*, pg. 208, Sep. 4, 1989.
"Liquid Heat Sink Cools Quietly, Takes Little Space," *Electronic Products*, Apr. 15, 1988.
"Newswatch, Canadian High Tech Show in Toronto Claims Success For Format," *Elecronic Products & Technology*, pp. 42–43, Nov./Dec. 1989.
"Thermal Management of a Microcomputer Using a Liquid Heat Sink," *Electronic Manufacturing*, pp. 19–20, Jun. 1989.
"Thermal-Management Products, Circuit Design Requires Thermal Expertise," *EDN*, pp. 93–102, Jun. 22, 1989.
3M Canada, Inc., Commerical Chemicals Division, Fluorinert Liquid Heat Sink—Second Runner-Up, Best Component, Canadian High Technology Show, Oct. 17 & 18, 1989.
"13th Annual Product of the Year Awards," *Electronic Products*, Jan., 1989.

*Primary Examiner*—Albert W. Davis, Jr.
*Attorney, Agent, or Firm*—Donald M. Sell; Walter N. Kirn; Eloise J. Maki

[57] ABSTRACT

A thermal transfer means comprising a flexible bag or pouch filled with a chemically inert, electrically nonconductive, nonflammable, essentially gas-free, thermally stable, thermally conductive, body of liquid comprising fluorochemical liquid. Said bag is fabricated from a flexible, durable plastic film that has low permeability to air and the fluorochemical liquid. The configuration of the bag is conformable to adapt to the geometry of the space, formed between the surface of a heat generating component or components and the surface of a heat sink, into which the bag is inserted, thereby contacting said surfaces and providing a thermal conduction path for heat generated by the heat generating component during operation from said component to the heat sink. The liquid has a boiling point such that it down not boil at the highest operating temperature of the device. Also provided is a method for making and filling the bag such that after sealing the bag is substantially gas free.

12 Claims, 2 Drawing Sheets

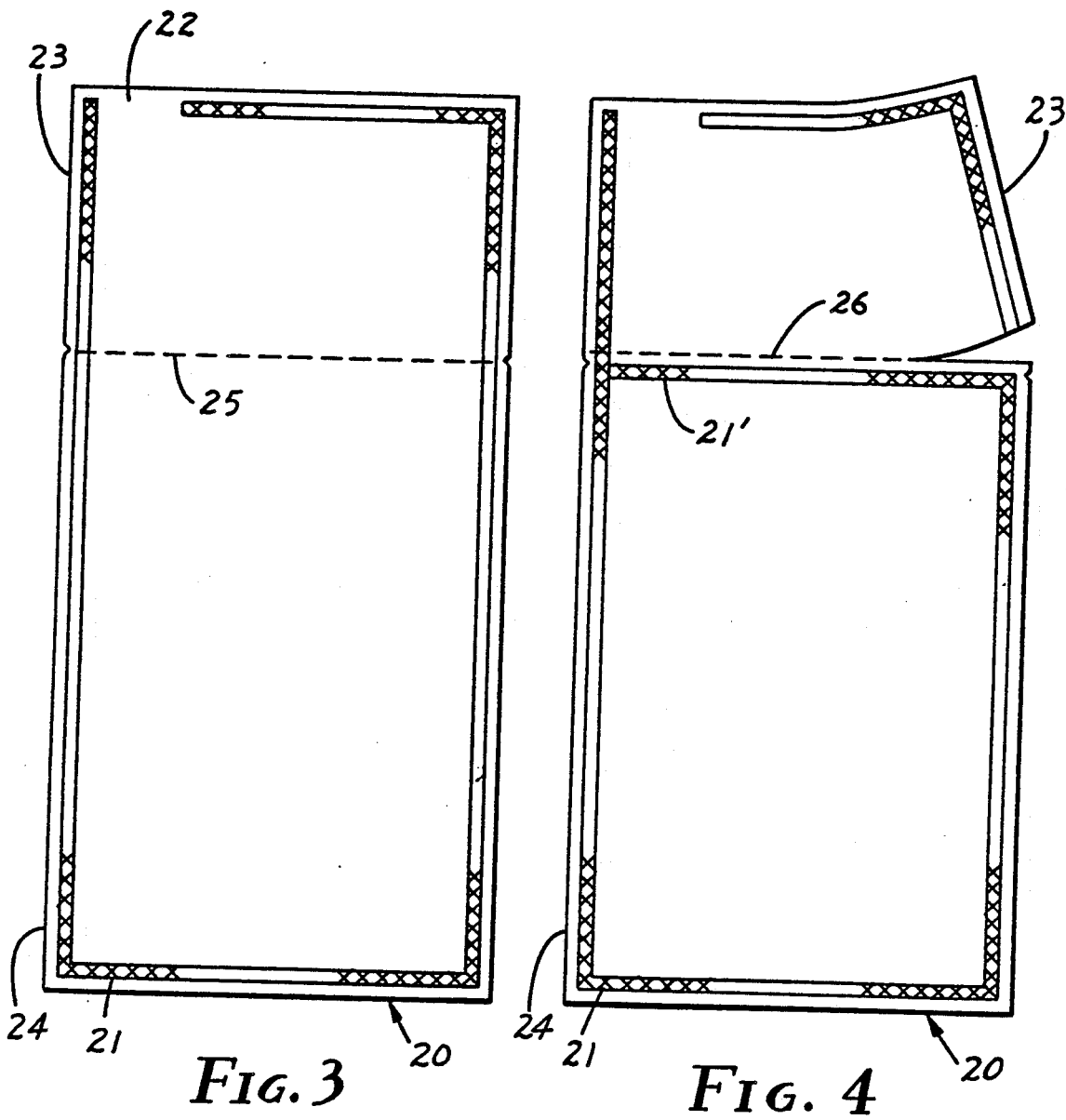

THERMAL TRANSFER BAG

This is a continuation of application Ser. No. 101,375, filed Sept. 25, 1987, now abandoned.

This invention relates to a thermal transfer or heat exchange means comprising an inert fluorochemical as a cooling medium for the transfer or dissipation of heat generated in the operation of heat generating devices such as heat generated by the computer disk drive or circuit board of a compact computer. In another aspect, it relates to a thermal transfer bag useful for such purpose and a method of making such bag. In a further aspect, it relates to the combination of such thermal transfer bag and a heat-generating device.

As the need or desire for electronic systems that are more compact has grown, various auxiliary heat transfer techniques have been suggested, proposed, or used to address the concurrent need or requirement of increased system cooling compatible with decreased or limited overall system size.

Compact electronic systems often do not have sufficient internal volume to support either fans or significant cooling airflow as a means to remove heat generated in the operation of such systems. Standard, forced-air convection cooling methods have practical limits because the amount of air required to provide sufficient cooling in the most compact systems generally creates an unacceptable noise level with respect to ambient office noise levels. Additionally, forced-air cooling without auxiliary cooling techniques cannot maintain each of a large number of electronic components within their critical, narrow operating temperature range.

In connection with large-scale electronic systems like super-computers or avionics systems, cooling with liquid immersion heat-transfer techniques have been employed using fluorocarbon liquids as the cooling medium. Such a system is disclosed in the paper by Danielson, Krajewski and Brost, *Cooling a Superfast Computer*, Electronic Packaging and Production, July 1986, pp 44–45. That paper discloses a method of cooling a supercomputer, the Cray-2 TM, by immersing the entire computer, power supplies., memory board, logic circuit, and main processors in a sealed tank of circulating, inert, high-dielectric, perfluorocarbon, Fluorinert ® electronic liquid FC-77.

U.S. Pat. No. 3,741,292 (Aakalu et al.), which describes the aforementioned limitations of forced air cooling and immersion techniques, discloses an air-cooled module in which a plurality of heat generating components are mounted on a substrate which has a container attached thereto in scaled relationship. Said module contains a sufficient volume of low boiling point, dielectric liquid to partially fill the container and immerse the heat generating component or components. A vapor space located above the liquid is filled with internal fins extending inward into the container which serve as a condenser for the dielectric liquid vapors. External fins extend outward from the container to serve as an air cooled heat sink for the internal fin condenser. One embodiment of the module uses a low boiling point, dielectric liquid such as one of the fluorocarbons FC-78 or FC-88.

Various other patents point out the problems of dissipating, carrying away, removing, or extracting heat generated from such electronic components, devices, or systems such as microminiature circuits, solid state electronics, integrated circuit chip packages, and computers and discuss the limitations of various heat exchange means that have been used or proposed in an attempt to solve such problems.

U.S. Pat. No. 3,586,102 (Gilles) discloses that the use of a solid heat transfer device inserted in microminiature circuit system between "heat-dissipating" plates and a heat-sinking component is impractical, and many problems and shortcomings are encountered if thermal greases are used as heat transfer means. That patent discloses, as a means for obviating those shortcomings, the use of a thermal pad adapted to be inserted between the heat-dissipating component and the heat-sinking component, the pad including a pair of strips of film adhered to each other with a quantity of thermal grease or the like being encapsulated therebetween. This pad rests upon and contacts heat dissipating elements mounted above heat generating electronic elements, such that the pad directly contacts the heat sink but does not directly contact the heat generating components.

U.S. Pat. No. 4,092,697 (Spaight) discloses cooling an integrated circuit package by means of a liquid contained in a film mounted on the underside of a cover enclosing the integrated circuit device. Said cover, film and liquid form a formable pillow such that when the cover is sealed to its chip/substrate assembly the pillow contacts the top of the chips mounted on the substrate.

U.S. Pat. No. 4,155,402 (Just) discloses a means of packaging a printed circuit board package. The circuit components are cooled by a liquid-cooled cold plate with a compliant mat interface. The interface is made of a film bonded to the underside of a liquid cold plate. Contained between the cold plate and the film is a paste such as thermal grease which can contain metal particles.

U.S. Pat. No. 4,563,375 (Ulrich) discloses a flat bag made of foils, such as aluminum, filled to only part of its maximum available volume with a thermally conductive paste without presence of gas, said bag being disposed between substantially planar surfaces or vertical slats as a means of heat transfer.

The present invention provides, as a thermal transfer or heat exchange means, a sealed, flexible bag, pillow or pouch having one or more compartments each filled with a thermally conductive, chemically inert, essentially gas-free, electrically nonconductive, thermally stable, preferably nonflammable, body of liquid comprising fluorochemical liquid, the wall of said bag being made of a flexible, durable, plastic film which is relatively impermeable to air and the body of liquid. The flexibility of the plastic wall, the latitude of the shape and size of the bag, and its liquid contents make the filled bag volumertrically conformable and readily adapted for placement in a heat generating device or system, such as in a cavity of a desk top computer, between and in intimate contact with a heat generating component of the device, like a circuit board or disk drive, and heat sink of the device, like a cold plate or system housing, to thereby provide a thermal path for readily conducting heat generated during the operation of the heat generating component to the heat sink, and thus effectively thermally manage the device or system. The thermally conductive liquid in the bag does not have to be circulated by mechanical means, such as, a pump, although there is movement of the liquid within the bag due to the small changes in liquid density associated with natural convective heat transfer in the liquid. The liquid has a boiling point such that it does not boil at the highest operating temperatures generated by the device; generally such liquids have boiling points of at least about 80° C. at 760 torr, and preferably boiling points of at least about 97° C. at 760 torr. The inherent shock-absorbing nature of the filled bag also acts as packing or a cushion to protect the device from physical shock damage, and the filled bag can be made and used without any metal or moving parts.

The present invention also provides methods of making said filled bag so that, once sealed, it contains only, if any, an insubstantial amount of gas or ullage. In making the bag, the empty bag compartments are filled, through openings in the bag, with specific weight or volumes of the thermally conductive liquid. Low liquid viscosity facilitates filling the bag compartments. Before sealing the compartments, the bag can be heated at or near the boiling point of the liquid for a sufficient time to expel dissolved or trapped air via the openings. The small amount of air that may remain in the bag after heating the liquid is expelled through the filling openings and the openings are subsequently sealed, for example the air is expelled by squeezing the compartment by hand until the air leaves the filled compartment through the filling opening and holding the opening closed, e.g., with a clamp, until the sealing is effected. Alternatively, the thermally conductive liquid to be used can be heated for a sufficient time to expel dissolved or trapped air before filling. In another alternative method gas, such as helium, with low solubility in the thermally conductive liquid can be bubbled through the liquid at ambient temperature for a sufficient time to expel dissolved or trapped air and the resulting de-gassed liquid used.

The fluorochemical liquid used in this invention has high dielectric strength, low dielectric constant and high volume resistivity, that is, it is electrically nonconductive. This makes it well suited for electronic cooling applications because the liquid is electrically nonconductive and will not cause short circuiting if the bag leaks and the leaked liquid contacts electronic devices. The liquid's inert character or lack of chemical reactivity with materials of construction (like metals, plastics and elastomers) means the liquid will not damage electronic devices or system housings if the leaked liquid contacts such devices or housings. The liquid's nonflammability means it will not create a potential explosion hazard. The liquid's thermal stability means it will maintain its physical and chemical properties through the life of the electronic device and through the repetitive thermal cyclings of the device normally encountered in the use of the device. Some of the thermally conductive liquids have relatively low boiling points and relatively high vapor pressures at ambient conditions. This makes some of said liquids very volatile, such that they will evaporate quickly, without residue, if the bag leaks, and the leaked liquid will not accumulate in the system and present removal problems. The liquid remains in the bag in substantially its liquid state, even if the liquid has high volatility, and does not boil at the normal operating temperatures of the heat generating device. Some of the thermally conductive liquids have high density, low-viscosity and relatively high thermal conductivity, that is they are thermally conductive and they have useful convective teat transfer properties. Efficient convective heat transfer within the filled bag leads to more efficient thermal transfer across the bag.

As a bag, the heat exchange means of this invention can be easily installed and removed from the electronic device. Since it is merely laid, inserted, or pushed in place, it can easily, be installed in the electronic device even during a field repair. There are no mechanical or metallurgical connections required between the bag and heat generating component or heat sink. The absence of such connections results in a minimum of abrasion and misalignment problems during the mating and demating of surfaces required for repair and maintenance. The bag is also appropriate for applications in which mechanical coupling to the electronic device is inappropriate, like disk drives. However, adhesives such as a pressure-sensitive adhesive (PSA), e.g., in the form of a double-coated (PSA) taps, can be used to fix the bag to appropriate heat sink or heat generating surfaces of the electronic device.

This invention provides a bag, in which the volume and surface area or configuration of the bag compartments can be varied so the bag can be substantially fill, or fills as necessary to accomplish the desired heat transfer, the cavity between the heat generating component and heat sink surfaces of the electronic device. In this way, the bag provides intimate contact between heat transfer surfaces, and cushions the devices from physical shock. Each compartment of said bag is substantially filled with the thermally conductive liquid. Since each compartment is sealed on all sides, the thermally conductive liquid is not free to flow from compartment to compartment, and thereby cannot migrate away from the heat transfer surface of the electronic device. The plastic film used to fabricate the bag provides resistance of the bag to abrasion or bursting. Additionally, this invention provides a method of filling the bags to produce substantially or essentially gas-free bags without prior evacuation of gas from the bags.

The shape of the bag can widely vary, for example it can be in the shape of a pillow or pouch and be of regular shape such as round or rectangular or of irregular shape, but in any case, its shape is dictated by factors such as the geometry or configuration of the cavity into which it is inserted; the ease of fabrication of the bag, and the heat transfer requirements of the heat generating device.

DESCRIPTION OF THE DRAWINGS

FIG 3. is a schematic, top view of the embodiment of FIG. 1 before filling;

FIG. 4 is a schematic, top view of the embodiment of FIG. 1 after filling; and

DESCRIPTION OF THE INVENTION

Figure 1:
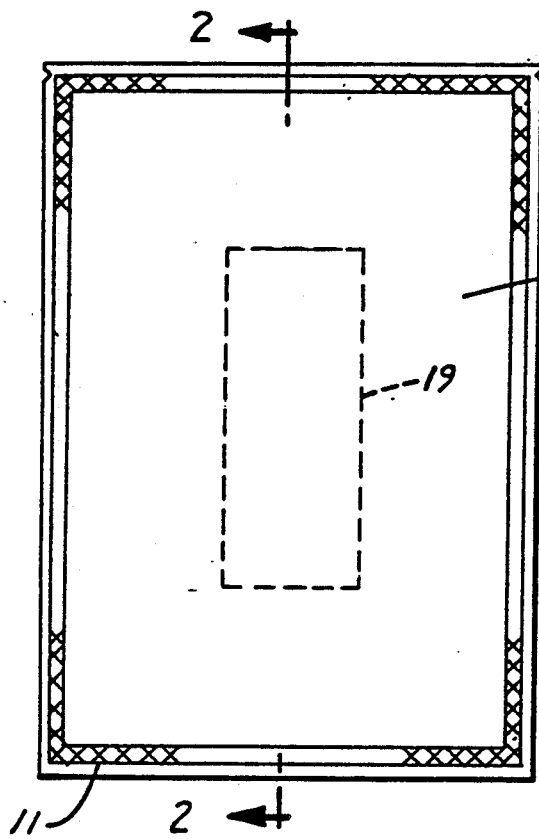
FIG. 1 is a schematic, top view of one embodiment of the invention.

In the accompanying drawing, FIG. 1 is a schematic, top view of one embodiment of this invention. FIG. 1 shows a liquid filled, flat, single compartment bag 10, having a shape and size conformable to the shape and size of the cavity of the electronic device in which it is to be inserted. The bag has seals 11 on all edges. Preferably the seals are made by heat sealing.

Figure 2:
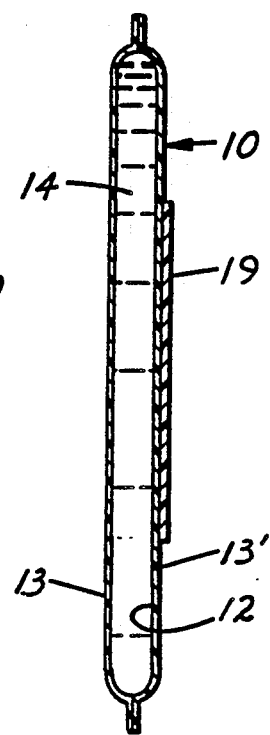
FIG. 2 is a cross-section of the embodiment of FIG. 1 along plane 2—2.

FIG. 2, a cross section of the embodiment shown in FIG. 1 taken along plane 2—2, shows a compartment defined by inner surface 12, and formed by two walls 13 and 13' of film heat sealed at the edges 11. The compartment defined by inner surface 12 formed between the film layers is filled with thermally conductive liquid 14. The thermally conductive liquid does not necessarily fill the entire available volume in said compartment, but said compartment is substantially gas-free and free of ullage. If the liquid does not fill the entire available compartment volume, said liquid is free to flow from one area of the compartment to another area of the compartment, such that the compartment can adapt and conform to the space or cavity formed between the heat-generating component or components and the heat sink.

Figure 5:
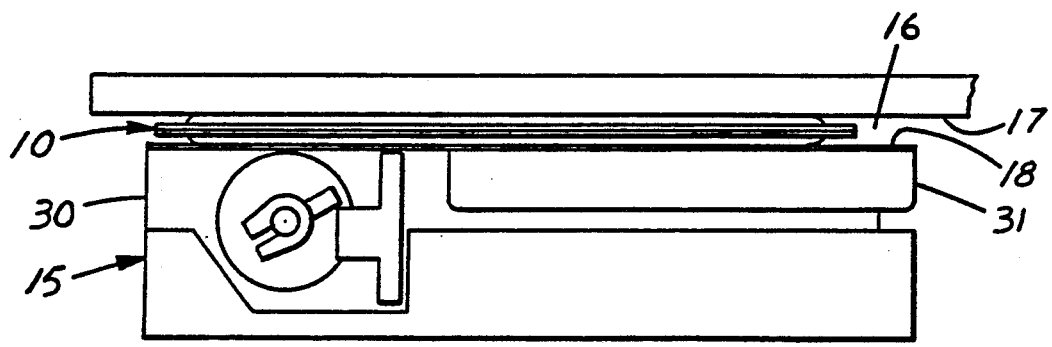
FIG. 5 is a schematic side view of one application of the embodiment of FIG. 1

FIG. 5 is a schematic side view of one application of the embodiment shown in FIG. 1 in an electronic device 15, here a compact computer, in which the liquid-filled bag 10 conforms to the cavity 16 formed between an internal heat sink surface 17 and the top 18 of a heat-generating electronic component of the device, here a disk drive. The volume of liquid in the compartment should be sufficient to cause the outer side surfaces of the bag to contact both surfaces of the heat sink and heat generating device.

Optionally, the bag can have adhesive on outer areas of one or both sides of the bag to further secure it in place in the cavity. The surface area of the bag covered by adhesive can include the entire surface area of the bag or a portion thereof. FIGS. 1 and 2 show one embodiment of this feature, a pressure-sensitive adhesive tape 19. Said tape is double-coated, comprising of a sheet backing having on each surface a normally tacky or pressure-sensitive adhesive. One example of such a tape is commercially available from 3M Co. as Scotch ® High-Tack/Low-Tack Double Coated Film Tape described in product brochure 70-0701-5133-0(17.1)R1XY, effective January 1987. Preferably, the face of the tape adhering to the bag has coated thereon a pressure sensitive adhesive having a 180° peel test value (measured by the PSTC No. 1 test for peel adhesion on a flat glass surface) of about 40-60N/100 mm tape width, and the other face of the tape has coated thereon a pressure-sensitive adhesive having a 180° peel test value of about 10-30N/100 mm tape width.

The thermally conductive liquids used in the heat transfer bags can be selected from the representative class of fluorinated linear, branched or cyclic alkanes, ethers, tertiary amines, and aminoethers, and mixtures thereof. Preferably, perfluorinated chemicals are used in this invention, though partially fluorinated chemicals can also be used. The perfluorinated chemicals can be straight chain, branched chain, or cyclic, or a combination thereof such as alkylcycloaliphatic, and are saturated, that is, free of ethylenic, acetylenic, and aromatic unsaturation. The skeletal chain can include catenary oxygen and/or trivalent nitrogen heteroatoms providing stable links between fluorocarbon groups and not interfering with the inert character of the compound.

Examples of such liquids include $CFCl_2CFCl_2$, $C_8F_{18}$, $C_8F_{17}Br$, $C_8F_{17}Cl$, $C_5F_{11}OC_6F_{13}$, $(C_4F_9)_3N$, $[(CF_3)_2NC_2F_4]_2O$, perflourodecalin, $C_6F_{13}C_6H_{13}$, $C_3F_7O[CF(CF_3)CF_2O]_nC_2F_5$, c-$C_8F_{16}O$, 1,3-c-$C_6F_{10}$-(COOCH$_3$)$_2$, $CF_3SO_2N(C_2H_5)_2$, 1,3,-$C_6H_4(CH_3)(OSO_2CF_3)$, $C_3F_7COO$-t-$C_4H_9$.

Representative examples of suitable perfluorinated chemicals or mixtures thereof are commercially available from 3M Co. as Fluorinert ® Electronic Fluids, described in 3M Co. product bulletin No. 98-0211-2267-0(161)NPI, issued February, 1986, e.g. Fluorinert ® liquid FC-75, which is a mixture of $C_8F_{18}$ and c-$C_8F_{16}O$, and Fluorinert ® liquid FC-77, which has a composition like FC-75 but has a broader boiling point range. Other commercially available fluorochemicals are those available from Montedison S.p.A. as GALDEN TM Perfluorinated Fluid described in the trade bulletin "Galden TM Perfluorinated Fluids", those available from E.I. Du Pont De Nemours and Co. as KRYTOX TM vacuum pump fluids, described in trade bulletin "KRYTOX Vacuum Pump Fluids", those from Daikin Industries, Ltd. as Demnum TM fluids described in product bulletin No. ECC-5c(003)YW issued January, 1987, those from Air Products Co. as MULTI-FLUOR TM those from ISC, Ltd., and from Ashai Glass Company.

The following table gives a description of the physical properties of the liquids useful in this invention:

| Physical Properties | Range |
| --- | --- |
| Dielectric constant (25° C.), (1KH$_2$) | 1.8–1.98 |
| Dielectric strength (25° C.) (2.54 mm gap) per ASTM D877-67 | 35–50 kV |
| Volume resistivity (25° C.) | $1.0 \times 10^{15}$ $-8.4 \times 10^{15}$ ohm-cm |
| Thermal conductivity (25° C.) | $6.0 \times 10^{-4}$– $7.0 \times 10^{-4}$ watts/cm °C. |
| Density (25° C.) per ASTM D941-55 | 1.73–2.03 g/cm$^3$ |
| Kinematic viscosity (25° C.) per ASTM D445-74 | 0.55–14 cs |
| Vapor pressure (25° C.) | <0.1–79 torr |
| Boiling point (760 torr) | 80–253° C. |
| Coefficient of expansion | $7.5 \times 10^{-4}$– $1/5 \times 10^{-3}$ cm$^3$/(cm$^3$)(°C.) |

Single or multilayer plastic film can be used to make the bag. Thermoplastic films are preferred because they are readily available and many are heat sealable. If said film is of multilayer construction, the layers or plys must be bonded so that they cannot be mechanically separated. The film can be chosen from the family of single or multilayer films that have properties of durability, flexibility and low permeabilities to air and the thermally conductive liquid. Multilayer films are preferred because each film layer can contribute its best characteristics, like heat sealability or fluid impermeability, to the overall film characteristics while a particular film's weaknesses, such as low durability or air permeability, can be compensated for by other film layers.

A representative range of film durability can be described by a tensile strength, M.D. Break (as measured per ASTM D882 Method A) of 2.69–3.4 kgf/cm, by an elongation, break M.D. (as measured per ASTM D882 Method A) of about 100% by an Elmendorf tear strength (as measured per ASTM D1922) of 32-no tear gm/ply, and by a Mullen burst strength range (as measured per ASTM D744) of 2.8–3.5 kgf/cm$^2$.

A representative range of film air-permeability can be expressed as oxygen permeability (as measured per ASTM D3985) of 0.4–7.0 cc/100 in$^2$/24 hr, at 760 torr.

A representative range of film permeability to thermally conductive liquid is 0–1 gram of bag weight lost after heating, per 100 grams of bag weight as measured before heating. Film permeability to thermally conductive liquid was measured by determining weight loss from a sealed bag filled with helium de-gassed Fluorinert ® FC-77 liquid after heating said bag in a horizontal position in an oven or like device held at 50° C., for 70 hours. Said bag was 8.23±0.08 cm wide, and 12.06±0.08 cm long before filling with about 56 ml of FC-77 liquid. Said liquid volume gave the sealed bag a thickness of 0.69±0.08 cm prior to heating the bag. In preparing the FC-77 liquid for filling the bag, helium gas was bubbled or spared through the liquid at a rate of 250 cc/min for 20 minutes, at normal ambient conditions. After heating the bag in the oven it was cooled to room before weighing.

Representative two-layer films are available from 3M Company as Scotchpak ® films described in product information sheets YZSP229(53.1)R1 published April, 1983, (66.02)R2 published June 2, 1983 and product information sheet "Heat Sealable Polyester Film 48" published July 1, 1985.

Representative three-layer films are available from C & H Packaging Co., Merrill, Wis. One example of a three-layer film has a nominal $8.9 \times 10^{-3}$ cm (3.5 mil) thickness, has a heat-sealable layer of polyethylene-co-vinyl acetate about 2 mils thick, laminated by adhesive to a layer of polyvinylidene chloride bonded to a layer of about 1 mil of polyamide.

Prior to filling, an empty bag is fabricated. One embodiment of said empty bag 20 is shown in FIG. 3, it shows the embodiment depicted in FIG. 1 prior to filling and final sealing. The empty bag is sealed on three edges 21. If the bag has more than one compartment, each compartment would be sealed on three of its edges. The fourth edge has a portion that is left open 22 for filling the compartment with thermally conductive liquid. In the embodiment depicted in FIG. 3, a filling sleeve 23 is formed by extension of the bag above the portion 24 which is ultimately going to be the finished bag, the top of which is indicated by 25. The length of sleeve 23 can be varied to facilitate filling. A specific amount, expressed in terms of volume or weight, of thermally conductive liquid is then introduced to the bag through the opening 22.

After filling the bag with liquid but before sealing, the filled bag and liquid held in an upright position, can be heated in an oven or like device until the temperature of the liquid is sufficiently high to expel trapped or dissolved air from the liquid, which in some cases is at or near its boiling point. The liquid is held at this temperature for a sufficient time to expel air from the liquid. In one embodiment of this method, a 8.23 cm wide, 12.06 cm long, 0.69 cm thick bag filled with about 57 ml of Fluorinert ® FC-77 liquid was heated for 20 minutes to expel air from the liquid. Alternatively, the air can be expelled from the liquid prior to filling the bag using the method described below.

After filling the bag and expelling air from the liquid, any remaining gas bubbles can be removed from the bag through the opening 22 and the bag is sealed 21' as shown in FIG. 4. Optionally, the filling sleeve 23 can be trimmed away at 26 after sealing the bag.

One method of purging gas from the liquid prior to filling the bag comprises heating the liquid in a vessel until the temperature of the liquid is sufficiently high to expel air from the liquid, as described above, and holding the liquid at this temperature until the air is expelled from the liquid. While the liquid is still hot, the bag is filled, remaining gas bubbles are displaced from the bag, and the bag is sealed.

Another method of expelling gas from the liquid comprises bubbling or sparging a gas with low solubility in said liquid through the liquid. The low solubility gas expels air from the liquid. Representative examples of gases with low solubilities in the thermally conductive liquid are hydrogen and preferably helium. A representative range of solubilities of such gases in the thermally conductive liquid is about 9–17 parts of gas by volume to 100 parts of liquid by volume, as measured at 25° C., 760 torr. In this method, the liquid is placed in a vessel vented to the atmosphere or the liquid can be placed in the bag compartments. The low solubility gas is bubbled o sparged through the liquid, at ambient temperature, and the air and low solubility gas are vented to the atmosphere. In preparing one embodiment, helium gas was bubbled at a rate of 250 cc/min through 700 ml Fluorinert ® FC-77 liquid for 20 minutes. In the embodiment thus described, a sealed bag filled with purged liquid was heated to 60° C. in a Fisher TM lab oven and held for a total time of 48 hours. No gas bubbles were visible in the bag after heating and none appeared after cooling the bag to 25° C.

The thermal transfer bags of this invention are useful to conduct heat away from a variety of heat generating components, for example, computer disk drives and circuit boards, to a heat sink resulting in a lowering of the device's operating temperature.

The following specific but nonlimiting example will serve to illustrate the present invention.

EXAMPLE

A multilayer, heat-sealable, thermoplastic film laminate, specifically, a polyvinylidene chloride layer sandwiched between a polyamide layer and a polyethylene-co-vinylacetate layer with nominal thickness of $8.9 \times 10^{-3}$ cm (3.5 mils) was fabricated into a single compartment bag, with the polyethylene-co-vinylacetate layer defining the compartment. The finished bag's structure like that depicted in FIG. 1 with dimensions of 8.23±0.08 cm meter 12.06±0.08 cm length, 0.69±0.08 cm thickness. The bag was fabricated slightly longer than the nominal, finished bag's dimensions. This excess length formed the filling sleeve.

The film material was sealed on three edges, as depicted in FIG. 3, with a Pac TM Impulse Sealer, model 24 PI. The fourth edge was sealed along all but about 1.3 cm of its length. Other temporary mechanical sealing methods, such as clamping, were also acceptable. The bag was filled through the unsealed opening with about 57–58 ml of Fluorinert ® FC-77 liquid using a graduated cylinder. The filled, unsealed bag was placed in an upright position in a Fisher TM lab oven preheated to 75°–80° C., and the bags were kept there for about 20 minutes. This was the time required for the liquid to reach 75°–80° C. and expel air from the liquid. The bag was removed from the oven and remaining air was manually displaced by squeezing the bag while the bag and its contents were still hot. The fourth edge of the bag was then sealed on the Pac TM Impulse Sealer and the filling sleeve was trimmed, to achieve the final bag dimensions. The finished bag contained about 56. ml of Fluorinert ® liquid FC-77.

The finished bag was placed in the cavity between the top surface of a 8.9 cm diameter disk drive and the metal housing of a desk top computer as depicted in FIG. 5. A PSA adhesive, two-sided tape fixed the bag to the internal surface of the computer housing, but the bag was not fixed to the disk drive. The computer and disk drive were operated under normal ambient conditions. The computer was also operated in another run without the bag. Temperatures were measured at two points on the disk drive housing, as shown in FIG. 5 at locii 30 and 31, with and without the bag. The results are summarized in TABLE-1.

TABLE 1

| Disk Drive Temperatures With and Without Thermal Transfer Bag | | |
| --- | --- | --- |
| | Temperature Measured at Locus 30 | Temperature Measured at Locus 31 |
| With Bag | 45.6° C. | 44.2° C. |
| Without Bag | 52.0° C. | 49° C. |
| Difference | 6.4° C. | 4.8° C. |

The results show the bag conducted enough heat away from the disk drive to the housing to lower disk operating temperature as shown in Table-1. It is estimated that disk drive life can be doubled for every 10° C. drop in operating temperature. Therefore, the temperature reduction caused by the bag can result in a significant increase in disk drive life. The overall heat transfer coefficient was determined experimentally to be 120 w/m$^2$°K. This is considerably better than would be predicted for such a system by correlations based on physical properties and geometry of the system for the heat flux being dissipated.

In one test, the filled bag maintained its integrity after being subjected to about a 50 G force caused by dropping the desk top computer in a drop test. The force was measured by a strain gauge mounted on the housing of said computer. In the same drop tests, the bag significantly dampened the vibration effecting said computer, caused by the force of dropping.

Various modifications and alterations of this invention will become apparent to those skilled in the art without departing from the spirit and scope of this invention.

What is claimed is:

1. A sealed, flexible, liquid-containing thermal transfer bag adapted for placement in a heat generating device between and in intimate contact with a heat generating component and a heat dissipating surface such as a cold plate or housing to conduct heat from said component to said heat dissipating surface, said bag comprising:

(a) a flexible, durable, air- and flourchemical-liquid-impermeable, plastic bag having one or more compartments; and (b) thermally conductive, chemically inert, essentially gas-free, electrically nonconductive, thermally stable, body of liquid comprising flourochemical liquid filling said compartments, said liquid having a boiling point such that it does not boil at the highest operating temperature of said device and having a thermal conductive of about 0.0006 to 0.0007 W/cm°C. at 25° C.

2. A thermal transfer bag according to claim 1, wherein said body of liquid has a boiling point of at least 80° C., preferably of at least 97° C.

3. A thermal transfer bag according to claim 1, wherein said heat, generating device is an electronic device.

4. A thermal transfer bag according to claim 1, wherein said thermally conductive liquid is perfluorinated liquid.

5. A thermal transfer bag according to claim 4, wherein said perfluorinated liquid is selected from the class of perfluorinated linear, branched or cyclic alkanes, ethers, tertiary amines, and aminoethers, and mixtures thereof.

6. A thermal transfer bag according to claim 1, wherein said bag is made of a multilayer, heat sealable, thermoplastic film.

7. A sealed, flexible, liquid-containing, thermal transfer bag adapted for placement in a heat generating device between and in intimate contact with a heat generating component and a heat dissipating surface such as a cold plate or housing to conduct heat from said component to said heat dissipating surface, said bag comprising:

(a) a flexible, durable, air- and flourchemical-liquid-impermeable, plastic bag having one or more compartments; and (b) thermally conductive, chemically inert, essentially gas-free, electrically nonconductive, thermally stable, body of liquid comprising flourochemical liquid filling said compartments, said liquid having a boiling point such that it does not boil at the highest operating temperature of said device; wherein said bag has an adhesive applied on its outer surface, said adhesive adapted to secure said bag in place in said cavity of said device.

8. A thermal transfer bag according to claim 7, wherein said adhesive is applied in the form of a double-coated, pressure-sensitive adhesive tape, the face of the tape adhering to the bag having coated thereon a moderately to highly aggressive PSA having a 180° peel test value (as measured by PSTC No. 1 test for peel adhesion in a flat glass surface) of at least 40–60N/100 mm tape width, and the other face of the tape, having coated thereon a weakly aggressive pressure-sensitive adhesive having an 180° peel test value of about 10–30N/100 mm tape width, said weakly aggressive pressure-sensitive adhesive surface being protected with a tape liner until used.

9. A thermal transfer bag according to claim 7 wherein said plastic bag comprises a multi-layer plastic file having a polyvinylidene chloride layer sandwiched between a polyamide layer and a heat-sealable polyethylene layer.

10. A thermal transfer bag according to claim 7 wherein said fluorochemical liquid has a thermal conductivity of about 0.0006 to 0.0007 W/cm°C. at 25° C.

11. A thermal transfer bag according to claim 7 wherein said body of liquid comprises perflourinated liquid.

12. A sealed, flexible, liquid-containing, thermal transfer bag adapted for placement in a heat generating device between and in intimate contact with a heat generating component and a heat dissipating surface, such as a cold plate or housing, to conduct heat from said component to said heat dissipating surface, said bag comprising:

(a) a flexible, durable, air- and flourchemical-liquid-impermeable, plastic bag having one or more compartments wherein said plastic bag comprises a multi-layer plastic film comprising a polyvinylidene chloride layer sandwiched between a polyamide layer and a heat-sealable polyethylene layer; and (b) thermally conductive, chemically inert, essentially gas-free, electrically nonconductive, thermally stable, body of liquid comprising flourochemical liquid filling said compartments, said liquid having a boiling point such that it does not boil at the highest operating temperature of said device.

* * * * *

UNITED STATES PATENT AND TRADEMARK OFFICE
CERTIFICATE OF CORRECTION

PATENT NO. : 4,997,032

DATED : MARCH 5, 1991

INVENTOR(S) : RICHARD D. DANIELSON ET AL.

It is certified that error appears in the above-identified patent and that said Letters Patent is hereby corrected as shown below:

Col. 2, line 54, "volumertrically" should be --volumetrically--.

Col. 3, line 65, "teat" should be --heat--.

Col. 4, line 4, "easily, be" should be --easily be--.

Col. 4, line 15, "taps," should be --tape--.

Col. 4, line 20, "can be substantially" should be --can substantially--.

Col. 4, line 50, Before "along" insert --taken--.

Col. 6, line 41, "theY" should be --they--.

Col. 7, line 8, "spared" should be --sparged--.

Col. 7, line 11, After "room" insert --temperature--.

Col. 8, line 59, "56.ml" should be --56 ml--.

UNITED STATES PATENT AND TRADEMARK OFFICE
CERTIFICATE OF CORRECTION

PATENT NO. : 4,997,032

DATED : MARCH 5, 1991

INVENTOR(S) : RICHARD D. DANIELSON ET AL.

It is certified that error appears in the above-identified patent and that said Letters Patent is hereby corrected as shown below:

Col. 9, line 46, "flourochemical-liquid-" should be -- fluorochemical-liquid- --.

Col. 9, line 61, Delete comma after "heat."

Col. 10, line 13, "flourochemical-liquid-" should be -- fluorochemical-liquid- --.

Col. 10, line 17, "flouro-" should be -- fluoro- --.

Col. 10, line 39, "file" should be --film--.

Col. 10, line 46, "perflourinated" should be --perfluorinated--.

Col. 10, line 55, "flourochemical-liquid-" should be -- fluorochemical-liquid- --.

Col. 10, line 64, "flouro-" should be -- fluoro- --.

Signed and Sealed this

First Day of September, 1992

Attest:

DOUGLAS B. COMER

*Attesting Officer*      *Acting Commissioner of Patents and Trademarks*